May 26, 1964 J. G. CHARASZ 3,134,947
AMPLITUDE STABILIZED TRANSISTOR OSCILLATOR
Filed Nov. 28, 1961
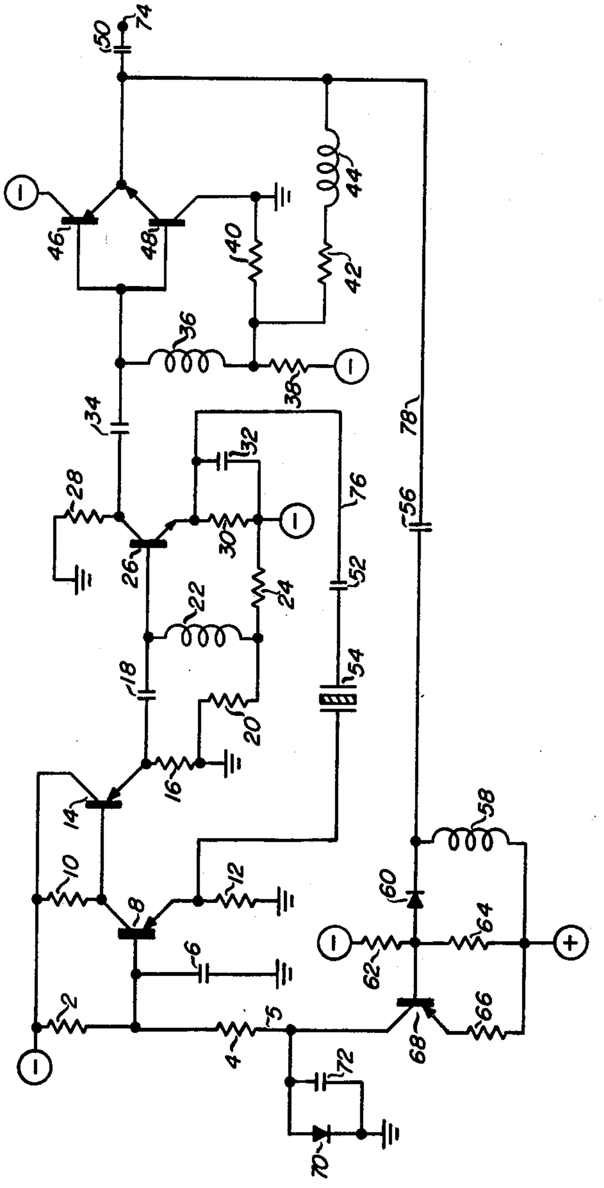
INVENTOR.
JERZY GEORGE CHARASZ
BY Henry L. Hanson
ATTORNEY 3,134,947
Patented May 26, 1964

3,134,947

AMPLITUDE STABILIZED TRANSISTOR OSCILLATOR

Jerzy George Charasz, Framingham, Mass., assignor to Minneapolis-Honeywell Regulator Company, Minneapolis, Minn., a corporation of Delaware Filed Nov. 28, 1961, Ser. No. 155,317
4 Claims. (Cl. 331—109)

A general object of the present invention is to provide a new and improved apparatus useful for producing electrical signal oscillations. More specifically, the present invention is concerned with a new and improved electrical oscillator circuitry which is characterized by its stability both in amplitude and frequency under varying load conditions including, in particular, varying capacitive load conditions.

In electronic data processing systems, particularly those of the synchronized type, it is necessary to have a reference clock for controlling the stepping of the system through its various programmed operations. The frequency of the synchronizing or clock signal in any particular system must be held to very close tolerances to insure that the associated circuitry is operating in its optimum range at all times. Further, in a typical data processing system of the digital type, the number of individual circuits that utilize the clock or synchronizing signals at any instant will vary and consequently, the loading of the clock signal supply circuit will be varying continuously during a system operation.

It is therefore a further more specific object of the invention to provide a new and improved electronic oscillator which will maintain a well regulated and stable output under varying load conditions.

The oscillator of the present invention takes the form of a circuit using only a crystal as the frequency-sensitive element in combination with transistor amplifying and isolating devices which are interconnected to provide the desired output without any frequency drifting or output amplitude variation. Thus, the circuitry is uniquely arranged so that the frequency producing portion of the apparatus is effectively isolated from the output and the amplitude regulation portion is arranged to operate outside of the frequency determining portion of the circuit and independently of any external reference signal source.

This has been achieved in a circuit that is adapted to accept transistors having slightly different characteristics without any accompanying loss of regulation and control.

Another object of the invention is therefore to provide a new and improved transistorized oscillator circuit incorporating novel isolating and regulating means to insure the circuit will function under varying load conditions and using varying types of transistor devices.

The various novel features which characterize the invention are pointed out with particularity in the claims annexed to and forming a part of this specification. For a better understanding of the invention, its advantages and specific objects thereof, reference should be had to the following detailed description and the accompanying drawings in which:

The single figure in the drawing in this specification illustrates schematically a preferred embodiment of the present invention.

Referring to the drawing, the present circuit will be seen to comprise at the input of the oscillator a transistor 8 having the usual base, emitter and collector. The transistor 8 functions as a grounded-base amplifier at the operating signal frequency. To this end a condenser 6 is connected between the base element and ground. A controllable D.C. bias potential is maintained at the base element by means of a resistive divider network comprising a pair of resistors 2 and 4. Resistor 2 is connected to a negative biasing potential and resistor 4 is connected to a line 5 which leads to a regulating signal source to be discussed below. As will be shown hereinafter, the current through the resistor divider network and consequently the bias voltage appearing at the base of transistor 8 will become a function of the amplitude of the output signal waveform. The collector element of transistor 8 is returned to a negative operating potential by means of a collector resistor 10 and is also connected to the base element of a transistor 14, the latter also having an emitter and a collector element. The emitter element of transistor 10 is returned to ground through an emitter resistor 12. Transistor 14 serves as an emitter-follower stage having its collector element return directly to a negaive operating potential. The output signal derived therefrom is developed across a load resistor 16 and this signal is coupled by means of condenser 18 to the base element of a further transistor 26. In order to establish a stable operating bias at the base of transistor 26, it becomes necessary to provide a high current voltage divider network. This is provided by a pair of resistors 20 and 24. Thus the values of resistors 20 and 24 must be of necessity be of a low value. In so doing, the low input impedance presented to the input signal would normally tend to decrease the signal output from the transistor 14. To avoid this condition, an inductor 22 is connected between the base and the junction of the biasing resistors to provide a high impedance to the signal on the output of transistor 14. This prevents any undue loss of signal due to the low impedance biasing circuit.

A first output signal is derived from transistor 26 by way of the voltage across a collector resistor 28 and this signal is coupled to a power amplifier circuit by means of a coupling condenser 34. A second output signal from transistor 26 is coupled from the emitter-connected end of a resistor 30 to the emitter element of the transistor 8 by way of the feedback line 76. This circuit is a regenerative feedback circuit which includes a D.C. isolation condenser 52 in series with a quartz crystal frequency determining element 54. In order to correct for phase shifts which may occur throughout the transistor amplifier stages, a condenser 32 may be added in shunt with emitter resistor 30.

The signal transmitted from the oscillator transistor 26 by means of coupling condenser 34 is connected to one end of an inductor 36 and to base elements of a pair of transistors 46 and 48. It will be seen that transistors 46 and 48 are connected in a complementary symmetrical emitter-follower configuration utilizing transistor types of opposite conductivity and having their respective emitter elements connected together. As is required on the input of the transistor 26, a high-impedance input circuit is required for the transistors 46 and 48 insofar as the oscillating signal is concerned. Thus, an inductor 36 is connected to a low impedance voltage divider network comprising a pair of resistors 38 and 40. The emitter elements are further connected by way of an inductor 44 and load resistor 42 to the common junction of resistors 38 and 40 and inductor 36. The output signal developed across the emitter load elements is coupled to an output terminal 74 by means of a coupling condenser 50.

A portion of the output signal from the transistors 46 and 48 is transmitted to an amplitude control circuitry by way of feedback line 78 and a condenser 56. The input to this portion of the circuit comprises an inductor 58 which is connected between condenser 56 and a source of positive biasing potential. The cathode of a diode 60 is also coupled to the condenser 56. The anode element of diode 60 is connected to the base element of a transistor 68 and to a common junction of a voltage divider comprising a pair of resistors 62 and 64. Resistor 62 is further connected to a source of negative biasing potential and resistor 64 is connected to the positive biasing source. The collector element of transistor 68 is connected to the line 5 and to a parallel connected condenser 72 and diode 70. The other end of the condenser 72 and the cathode element of the diode 70 are connected to ground.

Considering now the operation of the described system it will be seen that upon application of the proper operating potentials, transistor 68 will conduct and a controlled current will be established through a circuit that may be traced from the positive potential terminal through resistor 66, the collector-emitter path of transistor 68, and the series-connected resistors 4 and 2 to the negative supply terminal. The bias voltage thus established at the base of transistor 8 will allow the transistor to conduct heavily thus generating an output voltage across collector resistor 10. This voltage will be transmitted through transistor 14, which serves as an impedance-matching and isolating device to the input of transistor 26. It will follow that the signal will be further amplified and developed across emitter-resistor 30 and this will be applied to the feedback line 76. The crystal 54 in the line 76 will serve as a low impedance feedback path at its series resonant frequency for the specifically desired signal frequency and thus couple the amplified signal to the emitter element of transistor 8. The feedback path which is thus established will satisfy the criteria for sustained oscillation, namely, a closed loop gain through the traced circuit which is greater than one and a cumulative phase shift throughout the loop of 0 or 360°.

The output signal generated across the collector resistor 28 is coupled to the power amplifier transistors 46 and 48. The transistors 46 and 48 will become conductive on alternative half-cycles of the input signal waveform. The output signal obtained across the common emitter elements is coupled tto the output terminals 74 by means of the condenser 50.

In order to maintain a constant output amplitude in such a system, a sample of the output signal is coupled from the emitter elements of transistors 46 and 48 to input of the regulator circuitry by way of the feedback line 78. This signal is applied to the cathode element of diode 60 which functions as a rectifier. If the rectified output signals increase in amplitude, a negative bias level will be reached which can exceed the bias potential applied to the anode element of diode 60 by means of the voltage divider resistors 62 and 64. At such a time, the cumulative bias potential applied to the base element of transistor 68 will cause the current flow through the collector-emitter path to increase. The rectified and amplified waveform thus established at the collector element of transistor 68 will be filtered by means of condenser 72.

It will be noted that the current flow through the collector-emitter path of transistor 68 is dependent upon the voltage established at the base element and the value of emitter-resistor 66 with the consequent voltage drop thereacross. As such, transistor 68 may be considered to be a controlled current device whose output current is substantially independent of the collector impedance. As the oscillator output signal increases in amplitude, the current through the collector-emitter junction of transistor 68 will increase thus causing the biasing potential at the base element of transistor 8 to become more positive. The current flow through the base-emitter junction of transistor 8 will then decrease and cause an effective decrease in the output signal amplitude from transistors 8 and 26. The degenerative feedback current thus established will stabilize when the cumulative biasing voltage which includes the D.C. bias and the A.C. signal, which has been rectified, is coupled to the base element of transistor 68 and produces an average current flow through emitter resistor 66 of a sufficient value to bring the effective voltage existing across the base-emitter junction of transistor 68 to a predetermined value. This value will be such that the current flow in the output will cause the oscillator output to adjust to a level to effectively balance the input on transistor 68. It will be apparent that the operation within transistor 68 is a pulsating unidirectional signal which is filtered by the condenser 72. Thus, a direct current will be flowing through resistors 4 and 2 to provide the desired regulating bias.

It will be appreciated that the regulating circuit eliminates the need for a special external reference potential source but instead utilizes the normal operating potential source of the circuit. Furthermore, such a configuration is insensitive to the impedance changes in the collector circuitry so that the circuit does not require the substitution of a matched transistor should the need for such arise.

It will also be noted in the present combination that while the amplitude regulator portion of the circuit is connected directly to the input of the oscillator portion, the connection is at a low oscillating signal impedance point in the oscillator so that there will be substantially no loading of this signal due to the regulating circuit. The oscillator itself is also arranged so that there may be substantial power gain in the circuit by way of the emitter follower functioning between the transistors 8 and 26 with the oscillation frequency control element being only in the feedback loop and working at matched impedance levels in the circuit. Further, the input to the amplitude regulator portion of the circuit is effectively isolated from the oscillator by reason of the power transistors 46 and 48. This method of connection also insures that any changes in gain in the transistors 46 and 48 will be compensated for by the regulating circuit. All of these features combine to make the circuit one which is highly frequency-stable and the amplitude well regulated. This enhances the ability of the circuit to feed directly into the output power stages at transistors 46 and 48.

While in accordance with the provisions of the statutes there has been illustrated and described the best form of the invention known, it will be apparent to those skilled in the art that changes may be made in the apparatus described without departing from the spirit of the invention as set forth in the appended claims and that in some cases certain features of the invention may be used to advantage without a corresponding use of other features.

What is claimed as new and novel and for which it is desired to secure Letters Patent is:

1. An amplitude-stabilized oscillator system comprising a plurality of transistors each having a base, an emitter and a collector, a first transistor operated in a grounded base configuration for alternating current signals, a second transistor operated in an emitter-follower configuration adapted to receive output signals from said first transistor, a third transistor coupled to said second transistor and adapted to couple output signals to an output terminal, a first feedback path including a crystal frequency determining element regeneratively connected between the emitter elements of said first and third transistors, and adapted to sustain oscillations, a second feedback path connected from said output terminal to the base of said first transistor, said second feedback path including signal rectifying means and a fourth transistor connected to control the gain of said first transistor.

2. An amplitude-stabilized multi-transistor oscillator system wherein each transistor has at least a base element, emitter element, and collector element comprising a first transistor connected in a grounded base configuration for alternating current signals, a second transistor connected in an emitter-follower configuration and adapted to receive output signals from said first transistor, a third transistor, a first condenser adapted to couple alternating current signals from said second transistor to the base element of said third transistor, circuit means connected to provide a low impedance direct current biasing potential to the base element of said third transistor and a high impedance for said alternating current signals, a first feedback loop connected between the emitter elements of said first and third transistors and including a frequency controlling element, a second condenser adapted to couple output signals from said third transistor to a complementary symmetrical emitter follower stage, a second feedback loop connected from the output of said complementary symmetrical emitter-follower stage to the base element of said first transistor, said second feedback loop comprising a signal rectifier connected to the base element of a fourth transistor, said fourth transistor adapted to control the current flow through the base-emitter element junction of said first transistor.

3. An amplitude stabilized oscillator comprising a first transistor connected in a grounded base configuration for alternating current signals, means regeneratively connecting the collector and emitter elements of said first transistor to produce an oscillatory sustaining condition, means for rectifying an output signal from said oscillator, means connecting said rectifying means to a second transistor, direct current biasing means coupled to the base of said first transistor, means further connecting said biasing means to said second transistor, the latter being adapted to change the current flow through said first transistor in response to changes in the output signal amplitude.

4. A regulated oscillator circuit comprising a plurality of transistors each of which has a base, emitter and collector, a first of said transistors having the base thereof connected to ground by way of a condenser and connected to a regulating circuit, means including a second of said transistors connecting the collector of said first transistor to the base of a third of said transistors, means including a crystal frequency controlling element connecting the emitter of said third transistor to the emitter of said first transistor to form a regenerative oscillator circuit, means connecting the collector of said third transistor to the base of a fourth transistor, an output circuit connected to the emitter of said fourth transistor, means connecting a rectifier to said output circuit and to the base of a fifth of said transistors, and means connecting the collector of said fifth transistor to said regulating circuit of said first transistor.

References Cited in the file of this patent

UNITED STATES PATENTS

| | | |
|---|---|---|
| 2,968,738 | Pintell | Jan. 17, 1961 |
| 3,066,252 | Drake et al. | Nov. 27, 1962 |

FOREIGN PATENTS

| | | |
|---|---|---|
| 801,455 | Great Britain | Sept. 17, 1958 |